United States Patent
Ikawa

(10) Patent No.: US 9,257,829 B2
(45) Date of Patent: Feb. 9, 2016

(54) GROUNDING APPARATUS

(71) Applicant: Toshiba Mitsubishi-Electric Industrial Systems Corporation, Tokyo (JP)

(72) Inventor: Eiichi Ikawa, Tokyo (JP)

(73) Assignee: Toshiba Mitsubishi-Electric Industrial Systems Corporation, Tokyo (JP)

( * ) Notice: Subject to any disclaimer, the term of this patent is extended or adjusted under 35 U.S.C. 154(b) by 99 days.

(21) Appl. No.: 13/771,997

(22) Filed: Feb. 20, 2013

(65) Prior Publication Data

US 2013/0163133 A1    Jun. 27, 2013

Related U.S. Application Data

(63) Continuation of application No. PCT/JP2010/064090, filed on Aug. 20, 2010.

(51) Int. Cl.
| | |
|---|---|
| H02H 3/00 | (2006.01) |
| H02H 3/087 | (2006.01) |
| H02H 3/16 | (2006.01) |
| H01L 31/02 | (2006.01) |
| H02H 7/20 | (2006.01) |
| H02J 3/38 | (2006.01) |

(52) U.S. Cl.
CPC ......... *H02H 3/087* (2013.01); *H01L 31/02021* (2013.01); *H02H 3/16* (2013.01); *H02H 7/20* (2013.01); *H02J 3/383* (2013.01); *Y02E 10/563* (2013.01)

(58) Field of Classification Search
USPC .......................................... 361/42–50, 86–87
See application file for complete search history.

(56) References Cited

U.S. PATENT DOCUMENTS

| | | | | |
|---|---|---|---|---|
| 6,927,955 | B2 * | 8/2005 | Suzui et al. ..................... | 361/42 |
| 2009/0283130 | A1 * | 11/2009 | Gilmore et al. ............... | 136/244 |
| 2011/0031813 | A1 * | 2/2011 | Falk ................................ | 307/77 |
| 2011/0199707 | A1 * | 8/2011 | Kazemi et al. .................. | 361/47 |
| 2013/0222951 | A1 * | 8/2013 | Zhu et al. ........................ | 361/18 |

FOREIGN PATENT DOCUMENTS

| | | |
|---|---|---|
| CN | 201213224 Y | 3/2009 |
| JP | 04-12616 | 1/1992 |

(Continued)

OTHER PUBLICATIONS

Notification of the First Office Action from the State Intellectual Property Office of the People's Republic of China, dated Jun. 23, 2014, for counterpart Chinese Patent Application No. 201080068675.X, and English translation thereof (20 pages total).
English language translation of International Preliminary Report on Patentability from the Japanese Patent Office for International Application No. PCT/JP2010/064090, mailed Mar. 28, 2013.
First Office Action from the Japan Patent Office for Japanese Patent Application No. 2012-529469, dated Sep. 17, 2013.
Extended European Search Report, dated Mar. 5, 2014, issued for European Application No. EP 10856166.3, 7 pages.
English-language International Search Report from Japanese Patent Office for International Application No. PCT/JP2010/064090, mailed Nov. 22, 2010.

*Primary Examiner* — Danny Nguyen
(74) *Attorney, Agent, or Firm* — Finnegan, Henderson, Farabow, Garrett & Dunner, LLP

(57) ABSTRACT

A grounding apparatus includes a current detector configured to detect a current flowing in the ground line, a fuse inserted in series in a part of the around line and configured to melt when the current flowing in the ground line exceeds the first protection setting value, not destroying the current detector, and then exceeds the first protection setting value, causing a complete grounding fault, and a determination device configured to give an open command to the circuit breaker when the current detected by the current detector exceeds the first protection setting value of the circuit breaker.

3 Claims, 4 Drawing Sheets

(56) References Cited

FOREIGN PATENT DOCUMENTS

| JP | 11-18279 | 1/1999 |
| JP | 2000-014140 | 1/2000 |
| JP | 2001-169561 | 6/2001 |
| JP | 2001-275259 | 10/2001 |
| JP | 2001-298851 | 10/2001 |
| JP | 2004-215439 | 7/2004 |
| WO | WO 2008/061357 | 5/2008 |
| WO | WO 2008/108770 | 9/2008 |

* cited by examiner

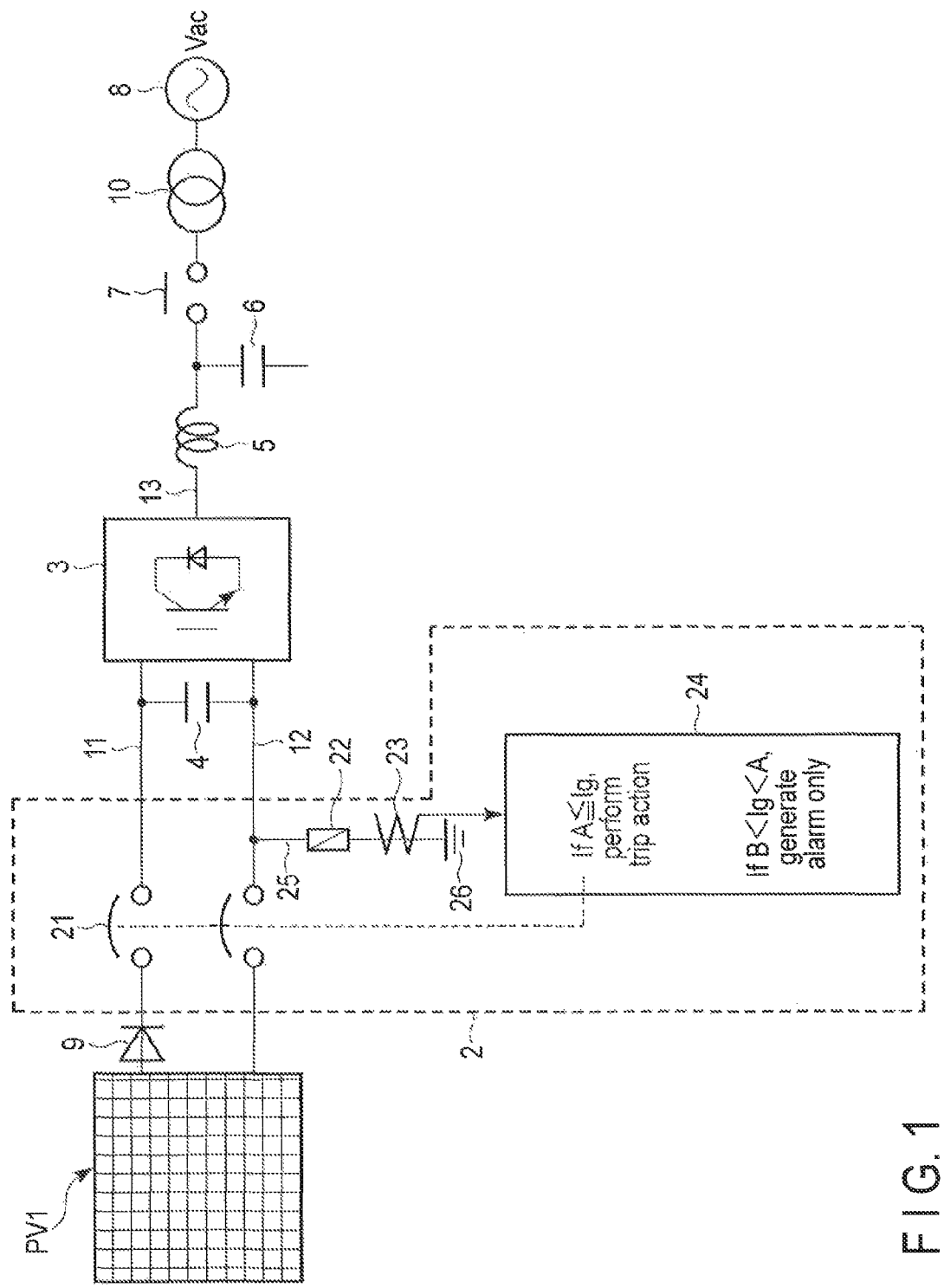
F I G. 1

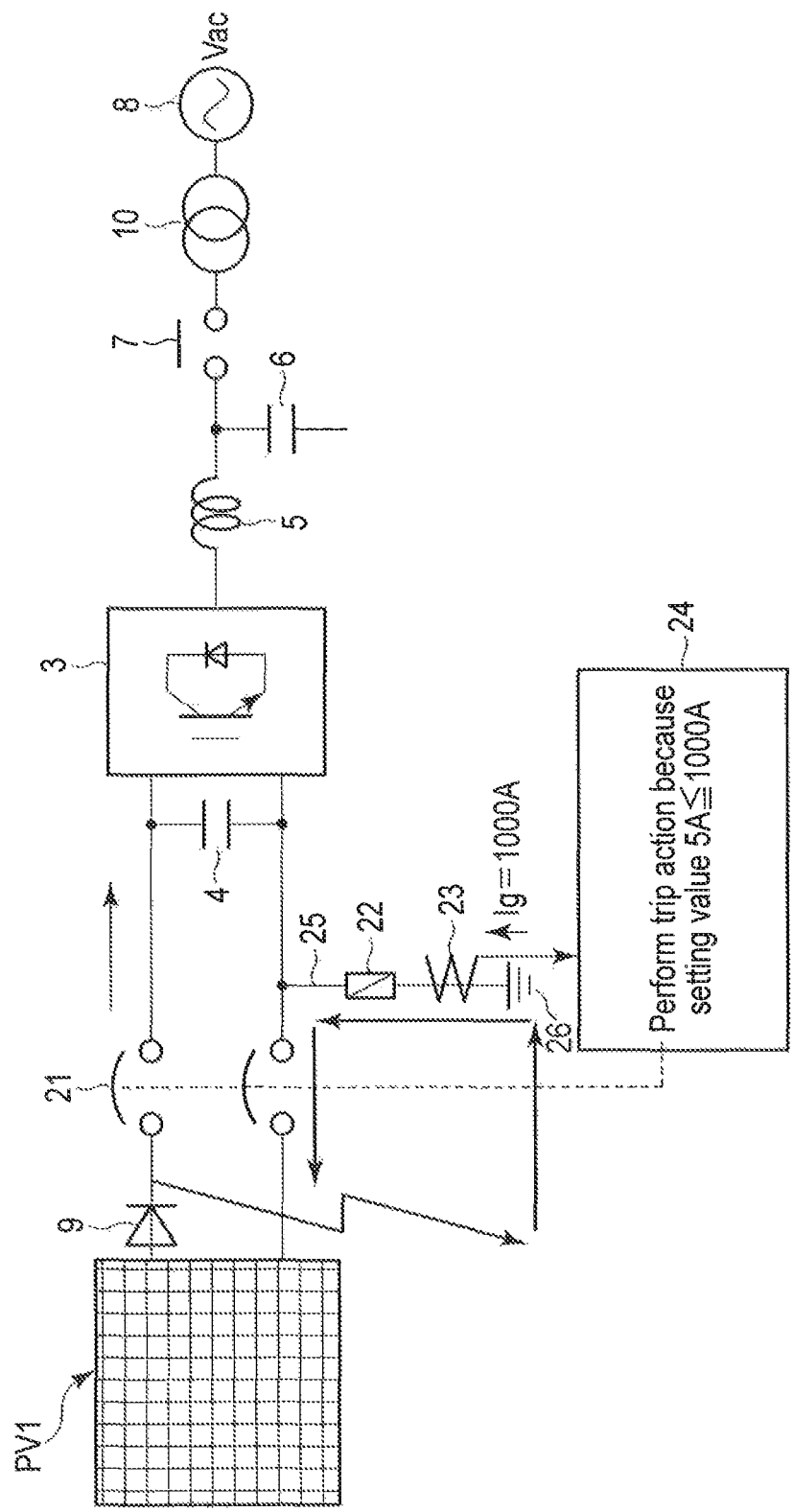
F I G. 2

US 9,257,829 B2

GROUNDING APPARATUS

CROSS-REFERENCE TO RELATED APPLICATIONS

This application is a Continuation Application of PCT Application No. PCT/JP2010/064090, filed Aug. 20, 2010, the entire contents of which are incorporated herein by reference.

BACKGROUND OF TEE INVENTION

1. Field of the Invention

The present invention relates to a grounding apparatus for use in a system in which a power conditioner converts the DC power generated in a DC power source, for example, a solar cell, to an AC power to be supplied to an AC power system, the grounding apparatus being provided between the ground and the AC positive bus or AC negative bus connecting the solar cell and the power conditioner.

2. Description of the Related Art

Patent Literature 1 discloses a power supply apparatus configured to supply the DC power from, for example, a solar cell to a grounded load. The power supply apparatus has a power supply means, a first output switch, a grounding fault detection circuit, and a control means. The power supply means has non-insulated power input and output terminal for supplying power to the grounded load. The first output switch is configured to connect or disconnect the power supply means to or from the grounded load. The impedance means is provided between the ground potential and a point near the power input terminal of the power supply apparatus. The grounding fault detection circuit has a voltage or current detection means and a ground switch. The control means is configured to control the first output switch and the grounding fault detection circuit. If the control means opens the first output switch and closes the ground switch, the grounding fault detection circuit detects a change in the main voltage at a point other than the grounded load, thus detecting a grounding fault, from the voltage or from the current detected by the current detection means.

So configured as described above, the apparatus disclosed in Patent Literature 1 can detect the grounding fault without connection to the grounded load.

Patent Literature 2 discloses an interconnection inverter in which a converter circuit and an inverter circuit, not insulated from each other at the out of the former and the input of the latter, convert DC power to AD power, and which outputs the AC power to a system connected to it. The interconnection inverter comprises a DC grounding fault detection means for detecting the grounding fault of the solar cell. The interconnection inverter further comprises a control means for controlling either the input voltage or the intermediate voltage between the converter circuit and the inverter circuit is controlled, either raising or lowering the voltage, thereby setting the ground potential of the solar cell to a value other than a near-zero potential. Thus, the grounding fault detected is a change in the main current.

In the interconnection inverter discloses in Patent Literature 2, described above, the control means controls the input voltage or the intermediate voltage, raising or lowering the voltage, ultimately setting the ground potential of the solar cell to a value other than a near-zero potential. Therefore, any grounding fault of the solar cell can be reliably detected.

CITATION LIST

Patent Literature

Patent Literature 1: Jpn. Pat. Appln. KOKAI Publication No. 2001-169561
Patent Literature 2: Jpn. Pat. Appln. KOKAI Publication No. 2001-27529

Assume that the DC input bus of a solar cell must be grounded in view of the use conditions and specification of the solar cell. Then, a ground bus is provided between the DC input bus and the ground, and an insulated transformer is provided between the AC power system (i.e., the output terminal) and the ground, thereby achieving insulation. If one line of the DC input bus is grounded, any other line thereof may undergo grounding fault to result in short-circuiting. If this happens, a short-circuit current will flow in the ground line. A fuse may be used in order to cut the short-circuit current path. However, it cannot be predicted when an incomplete grounding fault occurs (if impedance exits between the grounding fault point and the ground line). Nor can it be anticipated how large the short-circuit current is cannot be anticipated from the current-voltage (I-V) characteristic of the solar cell, which depends on the intensity of solar ray and the temperature. Therefore, a fuse of a specific capacitance, if used, may not melt in some cases, and the short-circuit current path may not be cut.

Instead, a current detector may be provided on the ground line. In this case, the ground current can be detected, and it can be detected whether a complete grounding fault has occurred (no impedance existing between the grounding fault point and the ground line) or whether an incomplete grounding fault has occurred. However, the grounding fault can hardly be precisely detected, depending on the magnitude of the short-circuit current, and the short-circuit current path between the grounding fault point and the ground line cannot be cut. Further, the ground line must be a conductor that allows the path of the short-circuit current.

BRIEF SUMMARY OF THE INVENTION

It is an object of the present invention to provide a grounding apparatus capable of instantaneously opening the current path when a complete grounding fault occurs between the ground point and the ground line, or opening the current path when an incomplete grounding fault occurs between them, or generating an alarm while keeping operation.

In order to achieve the object, the invention corresponding to claim 1 provides a grounding apparatus comprising: a DC power supply; a power conditioner configured to receive DC power of the DC power supply through a DC positive bus and a DC negative bus and to covert the DC power to AC power; an AC power system configured to supply the AC power from the power conditioner through an insulated transformer; a circuit breaker connected to the DC positive bus and the DC negative bus and configured to open a current path between the DC power supply and the power conditioner when a current flowing in the current bath exceeds a first protection setting value; a ground line connecting the DC positive bus or DC negative bus which is provided between the power conditioner and the circuit breaker, to the ground; a current detector configured to detect a current flowing in the ground line; a fuse inserted in series in a part of the ground line and configured to melt when the current flowing in the ground line exceeds the first protection setting value, not destroying the current detector, and then exceeds the first protection setting value, causing a complete grounding fault; and a determination device configured to give an open command to the circuit breaker when the current detected by the current detector exceeds the first protection setting value of the circuit breaker.

In order to achieve the object, the invention corresponding to claim 2 provides a grounding apparatus comprising: a DC power supply; a power conditioner configured to receive DC power of the DC power supply through a DC positive bus and a DC negative bus and to covert the DC power to AC power; an AC power system configured to supply the AC power from the power conditioner through an insulated transformer; a circuit breaker connected to the DC positive bus and the DC negative bus and configured to open a current path between the DC power supply and the power conditioner when a current flowing in the current path exceeds a first protection setting value; a ground line connecting the DC positive bus or DC negative bus which is provided between the power conditioner and the circuit breaker, to the ground; a current detector configured to detect a current flowing in the ground line; a fuse inserted in series in a part of the ground line and configured not to melt when the current flowing in the ground line is less than or equal to a current detection level, not destroying the current detector and causing an incomplete grounding fault; and a determination device configured to give an open command to the circuit breaker when the current detected by the current detector has a second protection setting value which is equal to the first protection setting value.

In order to achieve the object, the invention corresponding to claim 3 provides a grounding apparatus comprising: a DC power supply; a power conditioner configured to receive DC power of the DC power supply through a DC positive bus and a DC negative bus and to covert the DC power to AC power; an AC power system configured to supply the AC power from the power conditioner through an insulated transformer; a circuit breaker connected to the DC positive bus and the DC negative bus and configured to open a current path between the DC power supply and the power conditioner when a current flowing in the current path exceeds a first protection setting value; a ground line connecting the DC positive bus or DC negative bus which is provided between the power conditioner and the circuit breaker, to the ground; a current detector configured to detect a current flowing in the ground line; a fuse inserted in series in a part of the ground line and configured not to melt when the current flowing in the ground line is less than or equal to a current detection level, not destroying the current detector and causing an incomplete grounding fault; and a determination device configured to generate an alarm When the current detected by the current detector has a second protection setting value which is smaller than a protection setting value of the fuse.

In order to achieve the object, the invention corresponding to claim 4 provides a grounding apparatus comprising: a DC power supply; a power conditioner configured to receive DC power of the DC power supply through a DC positive bus and a DC negative bus and to covert the DC power to AC power; an AC power system configured to supply the AC power from the power conditioner through an insulated transformer; a circuit breaker connected to the DC positive bus and the DC negative bus and configured to open a current path between the DC power supply and the power conditioner when a current flowing in the current path exceeds a first protection setting value; a ground line connecting the DC positive bus or DC negative bus which is provided between the power conditioner and the circuit breaker, to the ground; a current detector configured to detect a current flowing in the ground line; a fuse inserted in series in a part of the ground line, configured to melt when the current flowing in the ground line exceeds the first protection setting value, not destroying the current detector, and then exceeds the first protection setting value, causing a complete grounding fault, and configured not to melt when the current flowing in the ground line is less than or equal to a current detection level, not destroying the current detector and causing an incomplete grounding fault; and a determination device configured to give an open command to the circuit breaker when the current detected by the current detector exceeds the first protection setting value of the circuit breaker, configured to give an open command to the circuit breaker when the current detected by the current detector has a second protection setting value which is equal to the first protection setting value, and configured to generate an alarm when the current detected by the current detector has a second protection setting value which is smaller than a protection setting value of the fuse.

According no the present invention, it is possible to provide a grounding apparatus capable of instantaneously opening the current path when a complete grounding fault occurs between the ground point and the ground line, or opening the current path when an incomplete grounding fault occurs between them, or generating an alarm (and preventing an operating error) while keeping operation.

BRIEF DESCRIPTION OF THE SEVERAL VIEWS OF THE DRAWING

FIG. 1 is a schematic diagram explaining a grounding apparatus according to a first embodiment of the present invention;

FIG. 2 is a diagram explaining a first operating mode of the grounding apparatus of FIG. 1;

DETAILED DESCRIPTION OF THE INVENTION

Figure 3:
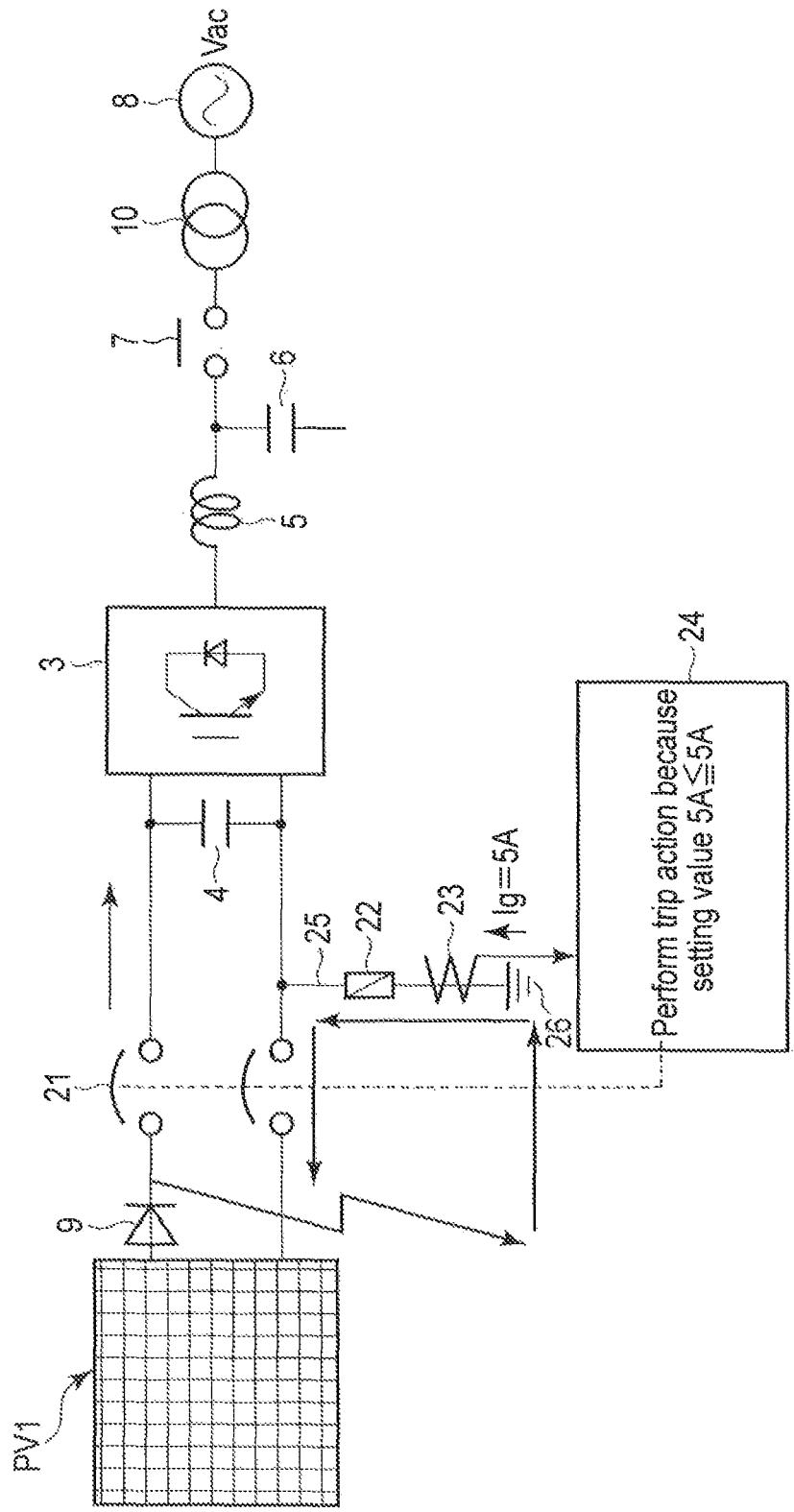
FIG. 3 is a diagram explaining a second operating mode of the grounding apparatus of FIG. 1.

Embodiments of the present invention will be described with reference to FIG. 1 to FIG. 4. A power conditioner, for example, inverter 3, converts AC power, or the output power of a solar cell (PV) 1, to AC power. The AC power is supplied to an AC power system 8. An insulated transformer 10 is provided on a connection bus 13 connecting the inverter 3 to the AC power system 8.

A smoothing capacitor 4 is connected between the DC positive (P) bus 11 and DC negative (N) bus 12 of the inverter 3. A snubber circuit composed of a reactor 5 and a capacitor 6 is connected to the connection bus 13, which connects the output of the inverter 3 to the insulated transformer 10. A switch 7 is provided on the connection bus 13 extending between the snubber circuit and the insulated transformer 10. Further, a reverse-flow prevention diode 9 is provided on a part of the DC positive bus 11, to which the output of the solar cell 1 and a circuit breaker 21 having a trip function are connected.

A grounding apparatus 2 according to the present invention is provided on the DC positive bus 11 and DC negative bus 12 extend between the output of the solar cell 1 and the smoothing capacitor 4. The grounding apparatus 2 comprises a circuit breaker 21, a ground line 25, a current detector 23, a fuse 22, and a determination device 24. The circuit breaker 21 is connected in series to the DC positive bus 11 and DC negative bus 12 and configured to perform a trip action when its protection setting value (current set) exceeds a prescribed value. The ground line 25 connects, for example, the DC negative bus 12 to which the circuit breaker 21 and smoothing capacitor 4 are connected, to the ground 26. The current detector 23 measures the current flowing in the ground line 25. The fuse 22 is provided on a part of the ground line 25, or connected in series thereto. The fuse 22 melts when the current flowing in the ground line 25 exceeds a current detection level, not destroying the current detector 23, and exceeds a first protection setting value (for example, 5 A) causing a complete grounding fault. The fuse does not melt when the current flowing in the ground line 25 has a current detection level (for example, a level which is less than or equal to 10 A) causing an incomplete grounding fault. The determination device 24 will be described below.

The determination device 24 gives the circuit breaker 21 an open command (trip command) when the current Ig (for example, 1000 A) detected by the current detector 23, exceeds the first protection setting value (for example, 5 A). Further, the determination device 24 gives the circuit breaker 21 an open command when the current Ig (for example, 5 A) detected by the current detector 23, has a second protection setting value (for example, 5 A) which is equal to the first protection setting value (for example, 5 A). Still further, the determination device 24 generates an alarm to a monitoring side (not shown) when the current Ig (for example, 1 A) detected by the current detector 23, has a second protection setting value (for example, 0.5 A) which is smaller than the protection setting value of the fuse 22.

As shown in FIG. 2, the fuse 22 is inserted in series in a part of the ground line 25. The fuse 22 melts when the current flowing in the ground line 25 exceeds a current detection level (for example, 10 A), not destroying the current detector 23, and exceeds the first protection setting value (for example, 5 A), causing a complete grounding fault. The fuse 22 does not melt when the current flowing in the ground line 25 has a current detection level (for example, a level which is less than or equal to 10 A), as shown in FIG. 3, not destroying the current detector 23 and causing an incomplete grounding fault.

The current detector 23 is, for example, a Hall CT, and is never saturated with a direct current. The current detector 23 can, of course, detect not, only an AC component, but also a DC component.

The current detector 23 and the fuse 22 have been selected to have the following relationship. That is, the current detector 23 is a small one that can measure a grounding fault current as small as a few amperes, and the fuse 22 melts at a current exceeding a protection setting value (for example, 5 A), which would not destroy the current detector 23.

The determination device 24 gives the circuit breaker 21 an open command (trip command) if the first protection setting value A equals the current Ig detected (A=Ig). If the second protection setting value B smaller than the current Ig detected, and current Ig is smaller than the first protection setting value A (B<Ig<A), the determination device 24 will give only an alarm to the above-mentioned monitoring side.

How the grounding apparatus 2 operates will be explained with reference to FIG. 2 to FIG. 4.

First, the complete grounding fault (short-circuiting) will be described with reference to FIG. 2. Assume that a current of 1000 A flows between the output of the solar cell 1 and the inverter 3. Then, the fuse 22 melts, instantaneously opening the ground circuit connected to the fuse 22 and current detector 23. At the same time, the determination device 24 gives a trip command to the circuit breaker 21, opening the circuit breaker 21, because the protection setting value is set to 5 A and the current detector 23 detects a current of 1000 A.

The incomplete grounding fault will be explained with reference to FIG. 3. Assume that a current of 5 A flows between the output of the solar cell 1 and the inverter 3. This current is equal to the protection setting value of 5 A, and the fuse 22 does not melt. The protection setting value is 5 A, and the current that the 23 detects is also 5 A. The determination device 24 therefore gives a trip command to the circuit breaker 21, opening the circuit breaker 21.

The case where the determination device 24 gives only an alarm to the above-mentioned monitoring side will be described, with reference to FIG. 4. If the current detector 23 detects a current of 1 A, the determination device 24 perceives the relationship of 0.5 A<1 A<5 A. The determination device 24 therefore gives only an alarm to the above-mentioned monitoring side.

Complete grounding fault and incomplete grounding fault shall be defined here. The complete grounding fault is a state in which the DC positive bus 11 and the DC negative bus 12 are connected to each other, while no impedance exists between the DC positive bus 11 and the DC negative bus 12.

In contrast, the incomplete grounding fault is a state in which DC positive bus 11 and the DC negative bus 12 are connected, while impedance exists between the DC positive bus 11 and the DC negative bus 12.

According to the grounding apparatus described above, it is possible to instantaneously open the current path when a complete grounding fault occurs between the ground point and the around line, or open the current path when an incomplete grounding fault occurs between them, or generate an alarm (and prevent an operating error) while keeping operation.

The grounding apparatus described above is therefore useful in a power conditioner designed for use in solar power generation, particularly in the case where the N grounding or P grounding must be achieved in the power conditioner.

Figure 4:
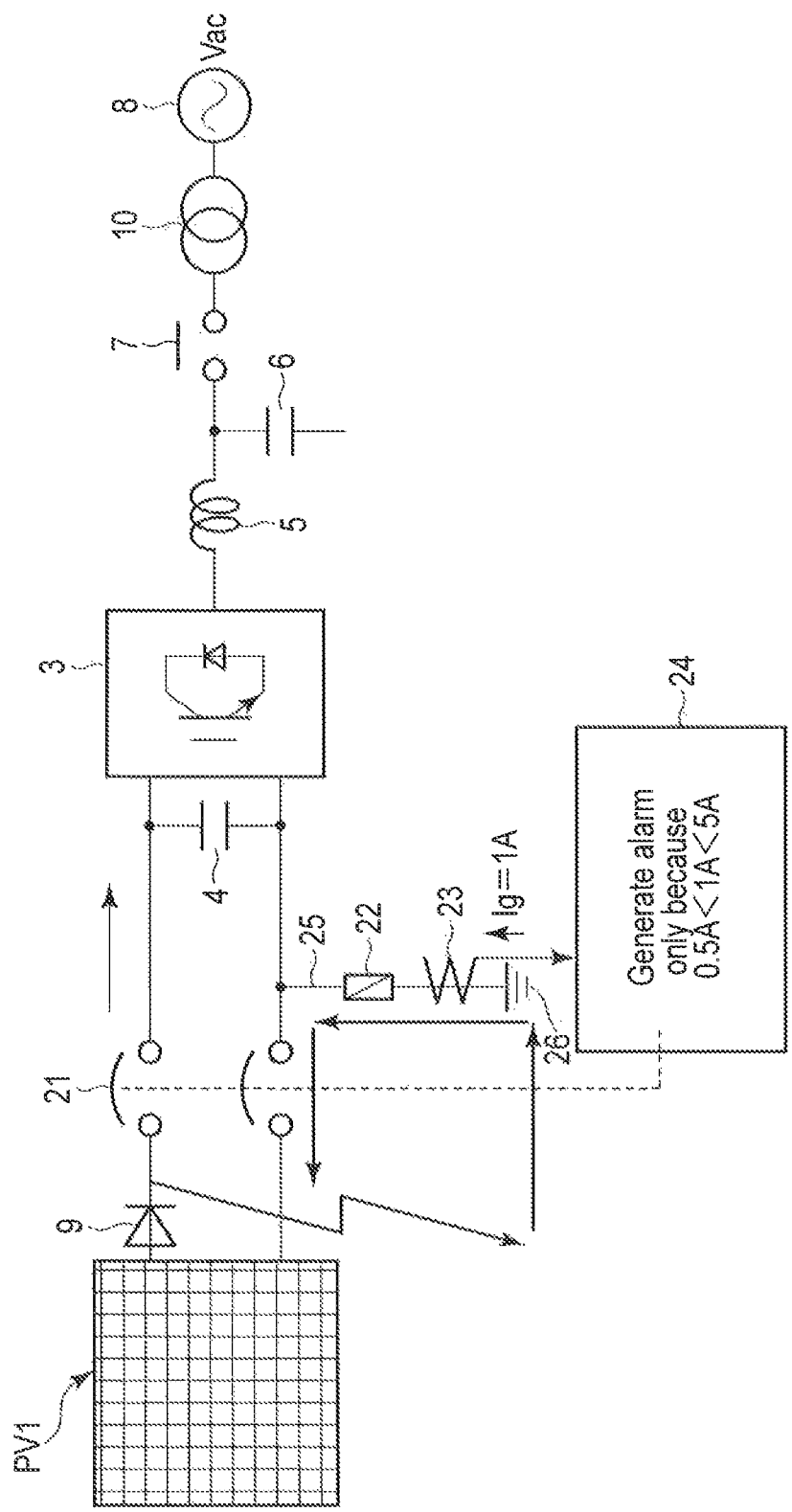
FIG. 4 is a diagram explaining a third operating mode of the grounding apparatus of FIG. 1.

In the embodiments described above, the determination device 24 has all functions specified in FIG. 2, FIG. 3 and FIG. 4, for explaining the operation of the present invention. Needless to say, the determination device 24 may have only one of these functions in the present invention, nevertheless.

Additional, advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A grounding apparatus comprising:
   a DC power supply;
   a power conditioner configured to receive DC power of the DC power supply through a DC positive bus and a negative bus and to convert the DC power to AC power;
   an AC power system configured to supply the AC power from the power conditioner through an insulated transformer;
   a circuit breaker connected to the DC positive bus and the DC negative bus and configured to open a current path between the DC power supply and the power conditioner;
   a ground line connecting the DC positive bus or DC negative bus which is provided between the power conditioner and the circuit breaker, to ground;
   a current detector configured to detect a current flowing in the ground line;
   a fuse inserted in series in a part of the ground line and configured not to melt when the current flowing in the ground line is less than or equal to a current detection level, not destroying the current detector and causing an incomplete grounding fault; and a determination device configured to generate an alarm when the current detected by the current detector has a second protection setting value which is smaller than a protection setting value of the fuse.

2. A grounding apparatus comprising:

a DC power supply;

a power conditioner configured to receive DC power of the DC power supply through a DC positive bus and a DC negative bus and to convert the DC power to AC power;

an AC power system configured to supply the AC power from the power conditioner through an insulated transformer;

a circuit breaker connected to the DC positive bus and the DC negative bus and configured to open a current path between the DC power supply and the power conditioner;

a ground line connecting the DC positive bus or DC negative bus which is provided between the power conditioner and the circuit breaker, to ground;

a current detector configured to detect a current flowing in the ground line;

a fuse inserted in series in a part of the ground line, configured to melt when the current flowing in the ground line exceeds a first protection setting value, not destroying the current detector, and then exceeds the first protection setting value, causing a complete grounding fault, and configured not to melt when the current flowing in the ground line is less than or equal to a current detection level, not destroying the current detector and causing an incomplete grounding fault; and a determination device configured to give an open command to the circuit breaker when the current detected by the current detector exceeds the first protection setting value of the circuit breaker, configured to give an open command to the circuit breaker when the current detected by the current detector has a second protection setting value which is equal to the first protection setting value, and configured to generate an alarm when the current detected by the current detector has a second protection setting value which is smaller than a protection setting value of the fuse.

3. The grounding apparatus according to any one of claims 1 to 2, wherein the current detection level not destroying the current detector is an offset value for preventing the determination device from making errors.

* * * * *